United States Patent [19]
Fox et al.

[11] Patent Number: 6,060,811
[45] Date of Patent: May 9, 2000

[54] ADVANCED LAYERED COMPOSITE POLYLAMINATE ELECTROACTIVE ACTUATOR AND SENSOR

[75] Inventors: Robert L. Fox, Hayes; Richard F. Hellbaum, Hampton; Robert G. Bryant, Poquoson; Benjamin M. Copeland, Jr., Smithfield, all of Va.

[73] Assignee: The United States of America as represented by the United States National Aeronautics and Space Administration, Washington, D.C.

[21] Appl. No.: 08/910,463

[22] Filed: Jul. 25, 1997

[51] Int. Cl.⁷ .................................................. H01L 41/08
[52] U.S. Cl. ............................................. 310/311; 310/328
[58] Field of Search ........................... 310/26, 306, 311, 310/324, 328, 348

[56] References Cited

U.S. PATENT DOCUMENTS

| | | | |
|---|---|---|---|
| 3,569,749 | 3/1971 | Zeiringer | 310/328 |
| 3,728,562 | 4/1973 | Herson et al. | 310/348 |
| 3,816,774 | 6/1974 | Ohnuki et al. | 310/334 |
| 4,088,915 | 5/1978 | Kodama | 310/334 |
| 4,211,951 | 7/1980 | Jensen | 310/329 |
| 4,310,730 | 1/1982 | Aaroe | 179/110 A |
| 4,907,207 | 3/1990 | Moeckl | 310/324 |
| 4,999,819 | 3/1991 | Newaham et al. | 310/334 |
| 5,440,193 | 8/1995 | Barrett | 310/348 |
| 5,471,721 | 12/1995 | Haertling | 310/363 |
| 5,589,725 | 12/1996 | Haertling | 310/338 |
| 5,632,841 | 5/1997 | Hellbaum | 310/311 |
| 5,781,646 | 7/1998 | Face | 310/367 |
| 5,802,195 | 9/1998 | Regan et al. | 310/324 |
| 5,816,780 | 10/1998 | Bishop et al. | 417/322 |
| 5,831,371 | 11/1998 | Bishop | 310/328 |
| 5,837,298 | 11/1998 | Face et al. | 425/456 |
| 5,849,125 | 12/1998 | Clark | 310/330 |
| 5,861,702 | 1/1999 | Bishop et al. | 310/330 |

OTHER PUBLICATIONS

D. Brei, et al., "Deflection–voltage performance of asymmetrically activated piezoelectric c–block actuators", SPIE, vol. 2717, 1996, 11 pages, Jan. 1996.

C. D. Near, "Piezoelectric actuator technology", SPIE Smart Structures and Materials Conference, 1996, 11 pages, Feb. 27, 1996.

S. Chandran, et al., "Crescent: A novel piezoelectric bending actuator", Intercollege Materials Research Lab., The PA State U, 1997, 9 pages., May 1997.

G. Haertling, "Rainbow actuators and sensors: a new smar technology", Clemson University, Mar. '94, 11 pages, Apr. 1994.

*Primary Examiner*—Thomas M. Dougherty
*Attorney, Agent, or Firm*—Linda B. B. Blackburn

[57] ABSTRACT

The present invention relates to the mounting of pre-stressed electroactive material in such a manner that large displacement actuators or sensors result. The invention comprises mounting the pre-stressed electroactive material to a support layer. This combination of a pre-stressed electroactive material and support layer may in turn be attached to a mounting surface. The pre-stressed electroactive material may be a ferroelectric, pyroelectric, piezoelectric, or magnetostrictive material. The size, stiffness, mass, and material of the support layer is selected to result in the electroactive device having dynamic response properties, environmental capability characteristics, and the required resilience optimized for a given application. The capacity to connect the support layer to a surface expands the arenas in which the pre-stressed electroactive device may be used. Application for which the invention may be used include actuators, sensors, or as a component in a pumps, switches, relays, pressure transducers and acoustic devices.

11 Claims, 9 Drawing Sheets

ADVANCED LAYERED COMPOSITE POLYLAMINATE ELECTROACTIVE ACTUATOR AND SENSOR

CROSS REFERENCE TO RELATED APPLICATION

This application is related to copending application Ser. No. 08/797,553, filed Jan. 24, 1997, entitled "Thin Layer Composite Unimorph Ferroelectric Driver and Sensor," commonly assigned with the present invention.

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

1. Technical Field of the Invention

The present invention relates generally to electroactive devices. Specifically the present invention relates to the use of electroactive actuators as the driving component of a bending type mechanical actuator capable of producing or experiencing large displacements.

2. Discussion of the Related Art

The related art includes 'Rainbow' ferroelectric actuators and sensors, more conventional ferroelectric actuators and sensors, and electromagnetic actuators.

Conventional piezoelectric actuators exhibit limited mechanical displacements. The output of conventional piezoelectric devices is limited by the piezoelectric material's relatively low piezoelectric displacement constant. Thus, conventional devices of reasonable thickness (i.e., on the order of a few millimeters) offer mechanical output motion only in the micrometer range. 'Rainbow' actuators, 'Moonies', unimorphic, and bimorphic piezoelectric actuators exhibit greater mechanical output motion. However, even thin ceramic wafers, those on the order of 0.25 mm, which exhibit the maximum observed output motion, provide a displacement limited to approximately 1 mm of motion in the z-direction for a device 3 to 4 centimeters in length.

The related art includes the designs disclosed in U.S. Pat. No. 5,471,721 by Haertling ('721). The first design utilizes a clamshell structure in which two arc shaped actuators are stacked such that their concave surfaces are oriented to face one another. A conductive sheet is located between the actuators. The actuators make contact with the conductive sheet only at the end points of their respective concave faces. The 'Rainbow' actuators are not attached to the conductive sheet. The complete assembly functions by allowing the end points of the actuators to slide on the rigid plate. The desired direction of force or deflection for the actuator assembly is perpendicular to the rigid plate. This sliding action results in frictional forces and abrasion of the actuators. The frictional forces created are not uniform over the entire range of motion of the actuators. This nonuniformity displays itself in the way of stiction, the noncontinuous motion of the actuator due to the build up of friction. Multiple clamshell units, separated by rigid plates, may be stacked to provide greater displacement potential.

A second design disclosed by the '721 patent is a stacking of multiple 'Rainbow' actuators. The individual actuators are separated by rigid conductive sheets and are oriented such that the convex surface of any 'Rainbow' is oriented to face the concave surface of any other 'Rainbow' in the stack. As in the previous design the complete assembly functions by the sliding of the actuators on the rigid plate. The desired direction of force or deflection for the actuator assembly is perpendicular to the rigid plate. As with the previously discussed '721 design, this sliding action results in stiction and abrasion of the actuators.

Additionally, these thin ceramic devices require special handling as they are extremely brittle, fragile, and prone to breakage. The delicate nature of these ceramic devices, combined with the limited means of fastening the individual devices in place, severely restricts the range of applications for which the devices are suitable, thus impairing their utility.

Another related art design is the "buzzer" used in audio speakers. The "buzzer" consists of a circular unimorph wafer mounted on a circular diaphragm. The diaphragm is secured along its edge. Electric stimulation of the unimorph causes the diaphragm to displace perpendicular to the plane of the diaphragm. The "buzzer" design does not use pre-stressed unimorphs.

It is accordingly an object of the present invention to provide an electroactive actuator with improved mechanical displacement.

It is another object of the present invention to provide a compliant mounting system for electroactive actuators and sensors.

It is another object of the present invention to improve the efficiency of the actuator.

It is another object of the present invention to remove noise from the output signal of the present invention when it is used as a sensor.

It is another object of the present invention to provide an electroactive actuator with improved durability.

It is another object of the present invention to provide an electroactive actuator with a non-electroactive mounting surface and support layer.

It is another object of the present invention to provide a means of mounting an electroactive device to another electroactive device.

It is another object of the present invention to provide a means of indirectly loading the electroactive element.

It is another object of the present invention to provide a means of changing or modifying the dynamic resonance of the electroactive devices.

It is another object of the present invention to provide a better transfer of mechanical and acoustical energy.

It is another object of the present invention to take advantage of the material characteristics of the support layer and the mass and extension of the support layer and mounting surface.

It is yet another object of the present invention to accomplish the foregoing objects in a simple manner.

Additional objects and advantages of the present invention are apparent from the drawings and specification which follow.

SUMMARY OF THE INVENTION

The present invention is a great improvement in electroactive actuator design. The present invention relates to mounting electroactive materials in order to harness their mechanical displacement capacity to form actuators and sensors. The present invention accomplishes this by attaching a supporting material to the electroactive material and then attaching the ends of the supporting material to another object, such as a spring, flat plate, a cylinder, the drive mechanism for a pump, the supporting material of another actuator, or any other surface. Unlike the related art, the instant invention requires neither the require rigid flat surfaces of the '721 patent, nor the completely secured diaphragm edges of the 'buzzer' type design.

The present invention utilizes electroactive materials of compound curvature having a planform area greater than its thickness. The thickness of the electroactive material is defined as the z-direction. The compound curvature of the element is in the plane of the thickness of the electroactive materials.

When the electroactive material is a ferroelectric or piezoelectric, electrical leads of gold, silver, nickel, or any electrically conductive material are attached to opposite surfaces of the electroactive materials, providing a device capable of use as either a sensor or actuator. Similarly, when the electroactive material is a pyroelectric, and it is desired to form a sensor, a pair of the previously described electrical leads are attached to opposite surfaces of the pyroelectric material. When the electroactive material used is a magnetostrictive material, the device can be used as either an actuator or sensor. In order to use the device as a sensor, the deflection of the magnetostrictive material must be measured. In order to form a magnetic field sensor with an electrical output, a layer of piezoelectric material may be used in conjunction with the magnetostrictive material. As the piezoelectric material is strained by the response of the magnetostrictive material to the presence of a magnetic field, an electrical signal is produced and transmitted through electrical leads attached to the piezoelectric material.

When excited by an electric current the piezoelectric or ferroelectric material deflects mainly in the z-direction. The direction of the deflection depends upon the direction of the current and the polarity of the electroactive material, while the amount of deflection is dependent upon the magnitude and polarity of the voltage employed. The deflection of the electroactive material in the z-direction either increases or decreases the radii of curvature of the electroactive material. This deflection of the electroactive material provides the motive power for the actuator. Alternatively, when the electroactive material is strained by an outside force an electric charge is produced. A sensor is produced by measuring the potential of this electric charge. The mechanisms that trigger responses in the electroactive material are magnetic fields for magnetostrictive materials, heat for purely pyroelectric materials, and strain for ferroelectric and piezoelectric materials.

The present invention is fabricated in accordance with U.S. Pat. No. 5,632,841 "Thin Layer Composite Unimorph Ferroelectric Driver and Sensor," incorporated herein by reference. First, a mold is selected for the device. A prestress layer, of larger planer dimensions than the electroactive material, is placed on the mold and a electroactive material layer is placed on top of the prestress layer. These layers are bonded together by heating and then cooling the assembled device. The prestress layer may be an adhesive and may include reinforcing material. The electroactive material layer may be a ferroelectric material, a piezoelectric material, a piezostrictive material, a pyroelectric material, a magnetostrictive material, or a composite. The electroactive material layer may include surface electrodes where required by the nature of the electroactive material. These electrodes may be applied by including an electrode layer on opposite surfaces of the electroactive material layer prior to heating the assembly.

DESCRIPTION OF PREFERRED EMBODIMENTS

Figure 2:
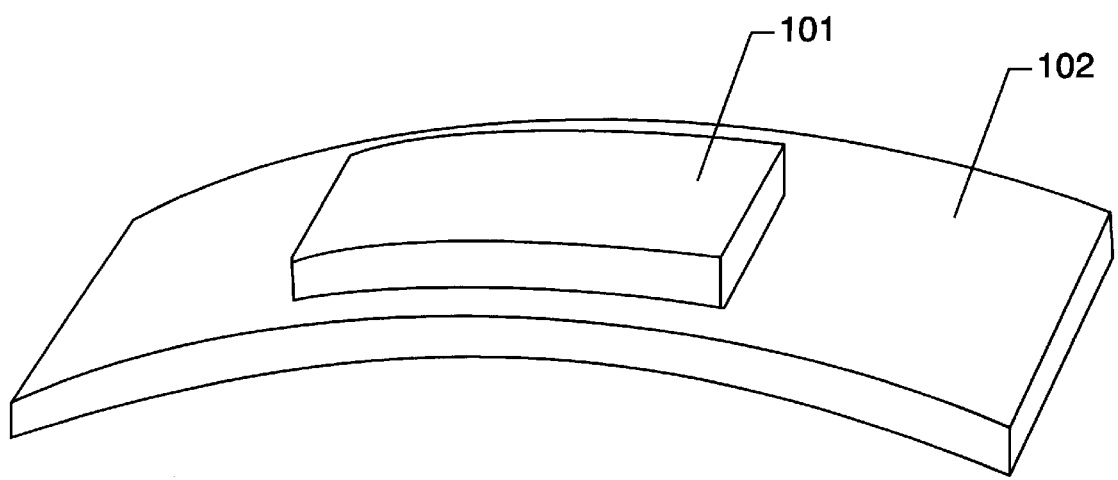
FIG. 2 is a perspective view of the basic embodiment.

The present invention is capable of use as either an actuator or a sensor. The most basic embodiment of the invention is the attachment of a layer of pre-stressed electroactive material having compound curvature to a thin, curved, support layer. The agent used to bond the electroactive material to the support layer may be a polymer, braze alloy, solder, or cerment, a ceramic based bonding agent. The support layer is shaped in such a manner as to allow the electroactive material to nest against it. The surface of the support layer attached to the electroactive material must be possessed of a surface area greater than the surface area of the mating surface of the electroactive material. Additionally, the support layer must be of sufficient size to extend beyond the boundaries of the surface of the electroactive material attached to it, and the entire face of the electroactive material in contact with the support layer must be attached to the support layer. FIG. 2 is illustrative of these relationships.

In the basic embodiment the support layer has an elongated planform. When the pre-stressing of the electroactive material is done by processing on a mold having a radius of curvature in a single direction only, the pre-stressed electroactive material is predisposed to increase or decrease this radius of curvature when excited. For convenience, the direction along this radius of curvature will be referred to as the length of the support layer, even though the device may be constructed in such a manner that this dimension is smaller than the dimension of the support layer oriented at 90 degrees to this radius of curvature. The support layer is of sufficient dimension to extend a distance beyond the edge of the electroactive material along the length of the device. This excess in dimension of the support layer over the pre-stressed electroactive material along the length of the device may continue the arc resulting from the forming over a curved mold, continue on a tangent to that arc, or be shaped to allow the mounting of the support layer to a surface or surfaces of any profile. The preferred material for the support layer is a metallic material such as steel, however, any material that remains elastic throughout the range of motion resulting from the excitement of the electroactive material, for example ceramics, composite materials, fiberglass, or plastics, may be used. The material must be resilient because the present invention uses the elastic properties of the supporting material to assist in returning the actuator or sensor to its unexcited position.

Further embodiments of the electroactive device require either the support layer or the electroactive material of the electroactive device be connected, in at least one location, to a mounting surface. The electroactive material may be located on either surface of the support layer.

Figure 1:
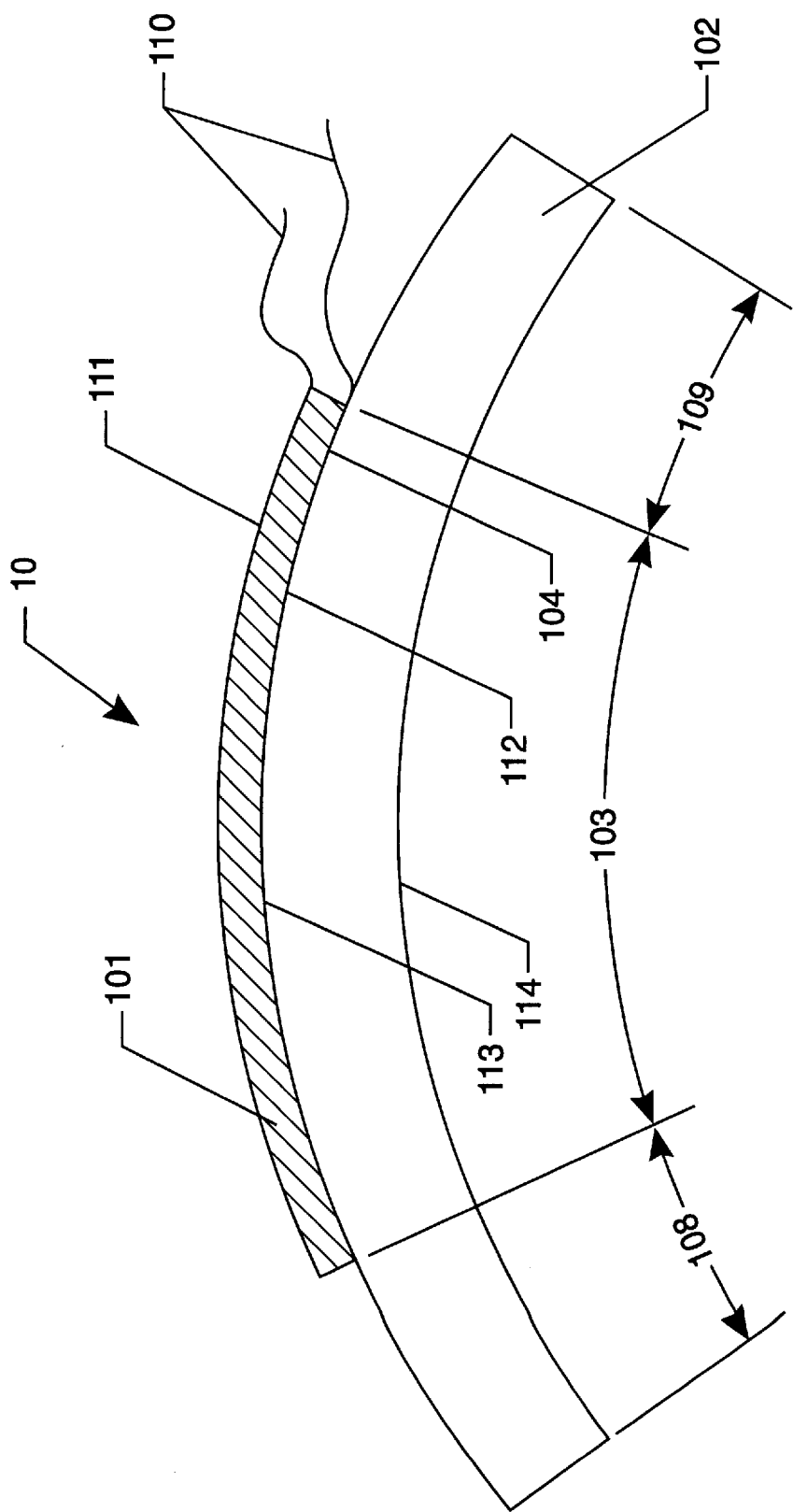
FIG. 1 is a side view of the basic embodiment.

FIG. 1 illustrates the basic embodiment 10 of the invention. An electroactive material 101 of compound curvature is bonded to a curved support layer 102 having a central portion 103, that conforms to the shape of the electroactive material 101. The support layer 102 is made of a flexible, resilient material. The basic embodiment 10 is fabricated according to the process of U.S. Pat. No. 5,632,841, "Thin Layer Composite Unimorph Ferroelectric Driver and Sensor," incorporated herein by reference. The support layer 102 may also serve as the pre-stressing layer. The central portion 103 of the support layer 102 has a convex surface 113 and a concave surface 114. The concave surface 112 of the electroactive material 101 is bonded to the convex curved surface 113 of the support layer 102. The support layer 102 extends beyond 108, 109 the electroactive material 101. Electrical leads 110 are connected to the convex surface 111 and concave surface 112 of the electroactive material 101.

A further embodiment of the present invention is a three layer actuator, identical to the previously described embodiment except for the addition of a mounting surface. This surface may be a metallic, ceramic, plastic, composite, or organic material. The mounting surface is contoured to allow it to be attached to the support layer. If the mounting surface is strip-like in nature, the contour of this strip is such that its makes contact with the support layer only along a portion of mounting strip's length.

Figure 5:
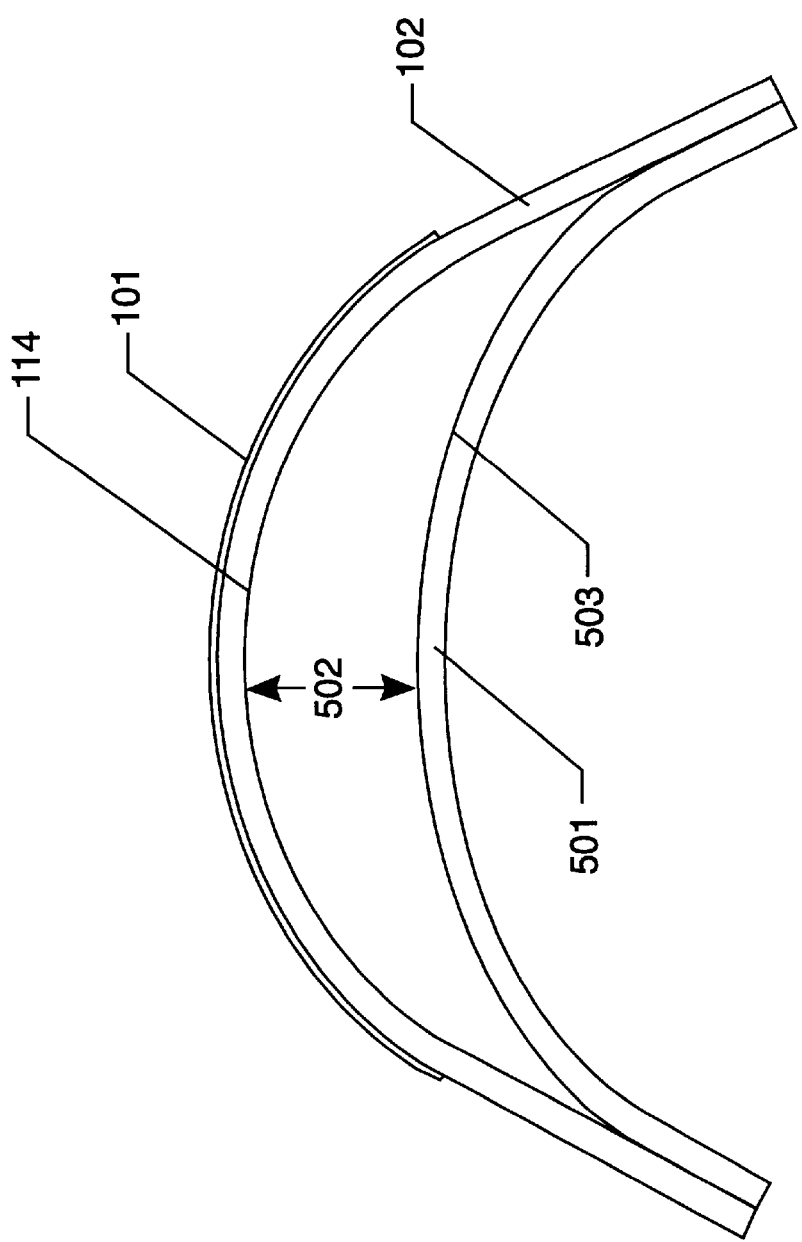
FIG. 5 is a side view of a bender actuator attached to a mounting surface.

FIG. 5 illustrates an embodiment of the present invention in which the mounting surface 501 is depicted as a strip. The material of the support layer 102 extending beyond the edges of the electroactive material 101 either continues the curvature of the support layer or is tangent to the curvature. The mounting surface 501 is contoured to fit inside the support layer 102 and is attached to support layer 102 by welding, bolting, riveting, bonding, hinging, clamping, or any other means well known in the art, to moderate relative motion between the upper surface 503 of the mounting surface 501 and the concave surface 114 of the support layer 102. The mounting surface 501 is contoured such that when attached in the above described manner to the support layer 102, a gap 502 exists between the upper surface 503 of the mounting surface 501 and the concave surface 114 of the support layer 102. FIG. 5 depicts the mounting surface 501 as a thin strip; this depiction, however, should not be considered a limitation. As previously stated, the mounting surface may be a single surface, of which FIG. 5 is illustrative of a single embodiment, namely a strip of complementary contour to the electroactive device. A viable alternative is the mounting of the electroactive device to the complementary contour of an object that is massive relative to the electroactive device.

Figure 6:
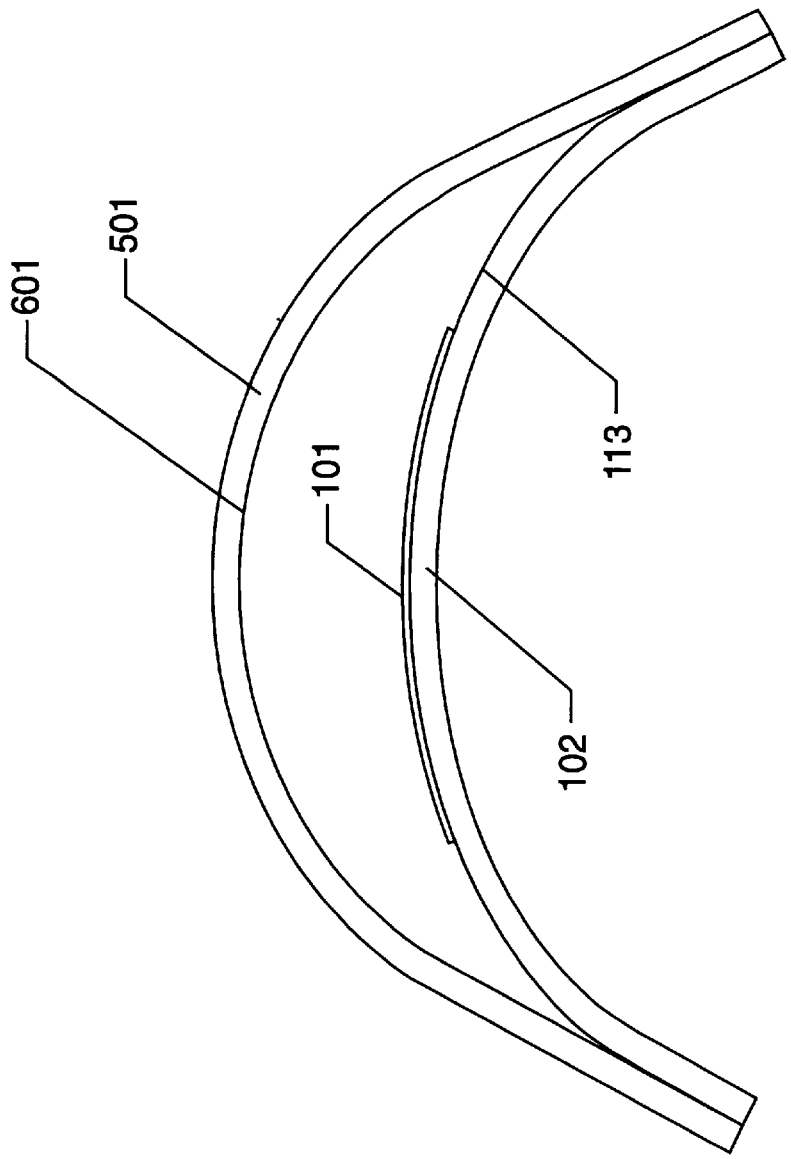
FIG. 6 is a side view of a bender actuator attached to a mounting surface.

FIG. 6 illustrates an alternative embodiment of the device illustrated in FIG. 5 in which the lower surface 601 of the mounting surface 501 is attached to the convex side 113 of the support layer 102.

Figure 3:
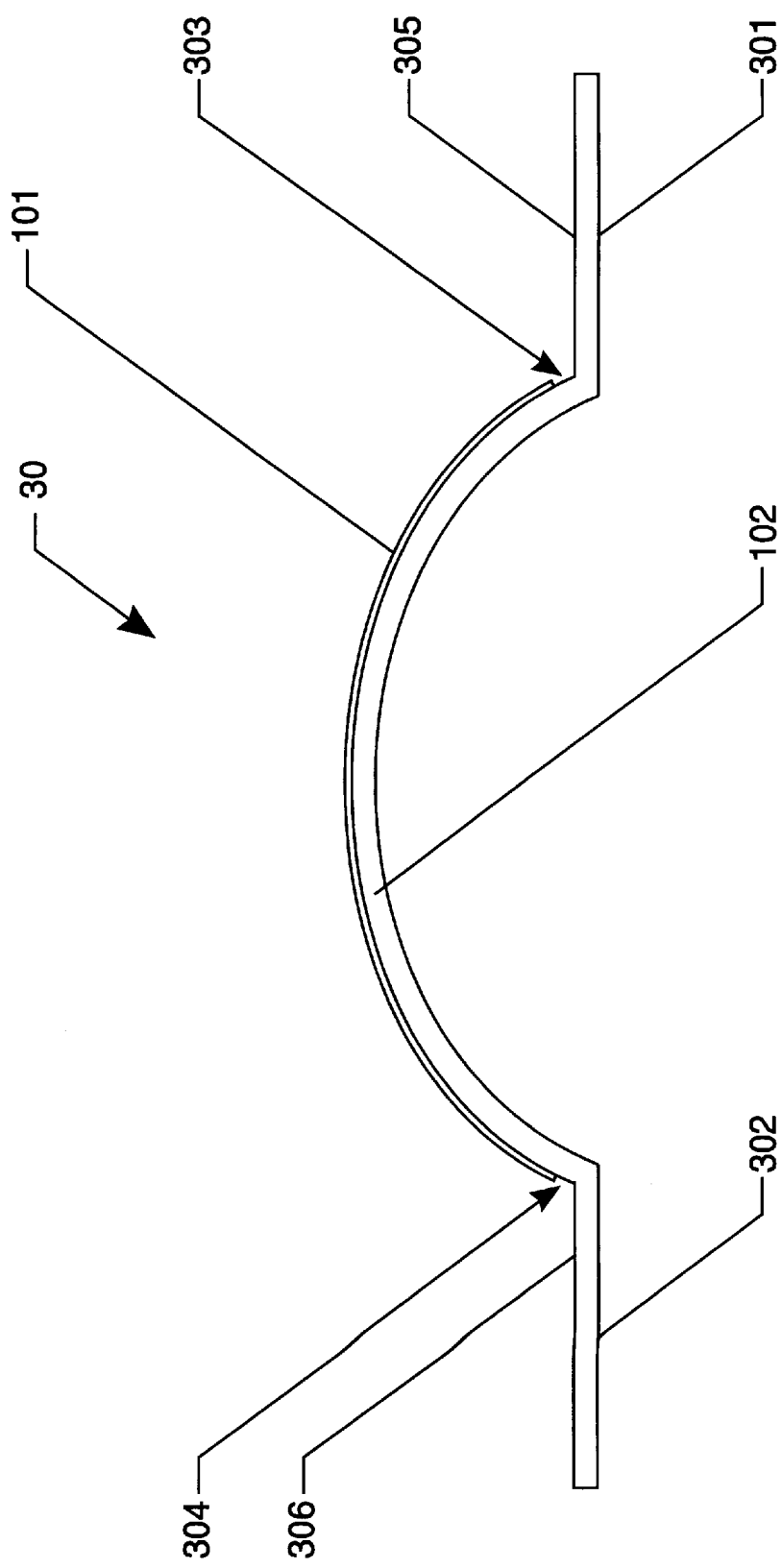
FIG. 3 is side view of a bender actuator embodiment.

FIG. 3 illustrates an alternative embodiment of the invention, a bender unit 30, in which the material of the support layer 102 extending beyond 108, 109 the edges of the electroactive material 101 is formed into flanges 301, 302 at some angle to the curvature of the support layer 102. Radii 303, 304 are formed at the intersection of the convex surface 113 of the support layer 102 and the upper surfaces 305, 306 of the flanges 301, 302. A mounting surface may then be attached to the flanges. The mounting surface may be of any profile or material and may also be a single surface on a single object, multiple faces of a single object or surfaces of multiple objects.

Figure 4:
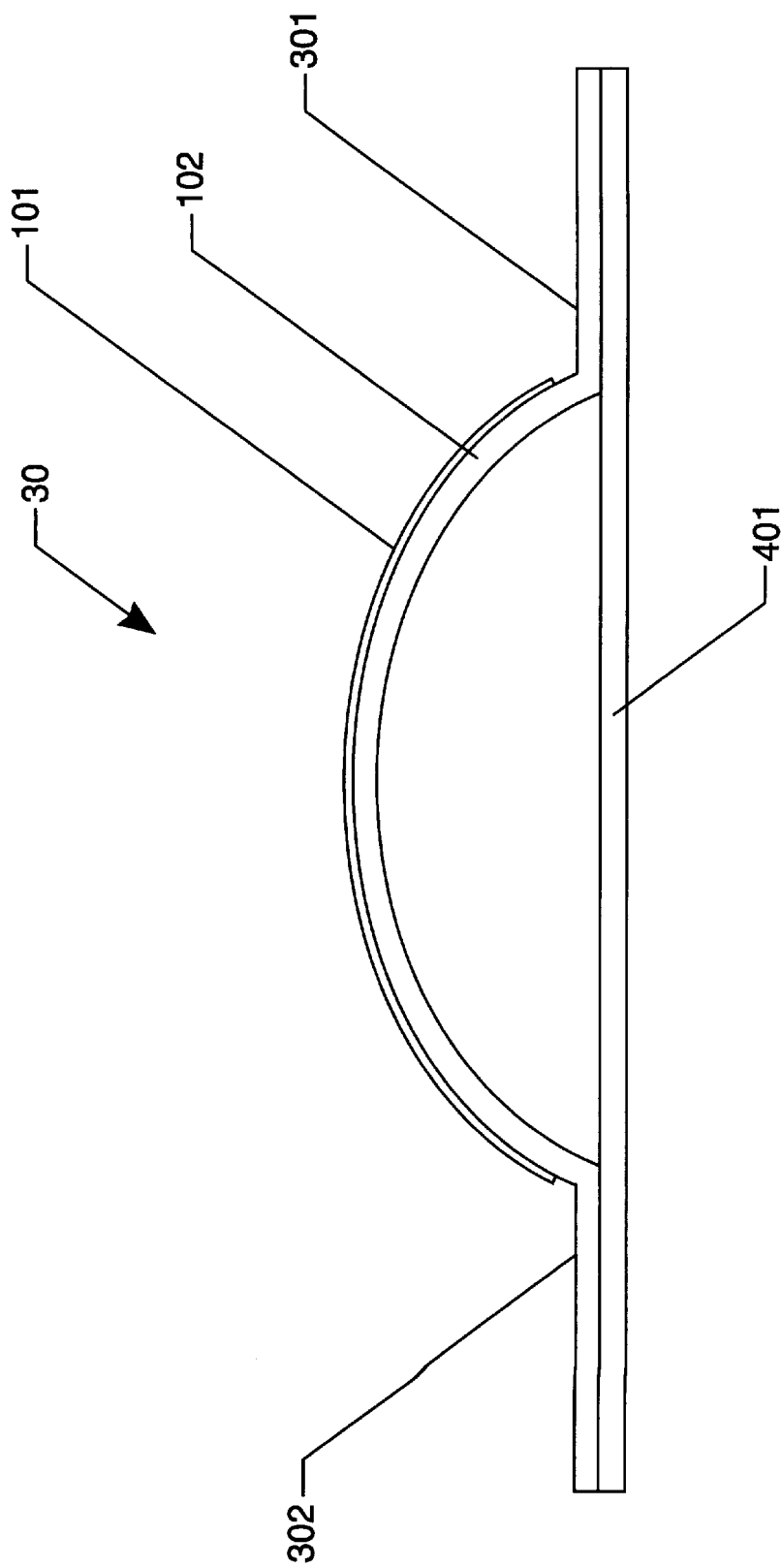
FIG. 4 is a side view of a bender actuator attached to a platform.

FIG. 4 illustrates the mounting of the embodiment illustrated in FIG. 3 to a platform 401. The electroactive device 30 is mounted to the platform 401 by adhesive bonding, welding, soldering, riveting, bolting, or any other means of attachment that moderates relative motion between the support layer 102 and the platform 401. The platform 401 may be of a thin flexible material, or of such stiffness and size to force all of the energy produced from the deflection of the electroactive material 101 to be utilized in the deformation of the support layer 102.

Another embodiment of the present invention is geometrically identical to the previously disclosed manifestation of the three layer actuator embodied in FIG. 4 with the exception that the support layer 102 acquires the geometry of the platform 401 and the platform 401 then takes on the geometry of the support layer 102.

Figure 7:
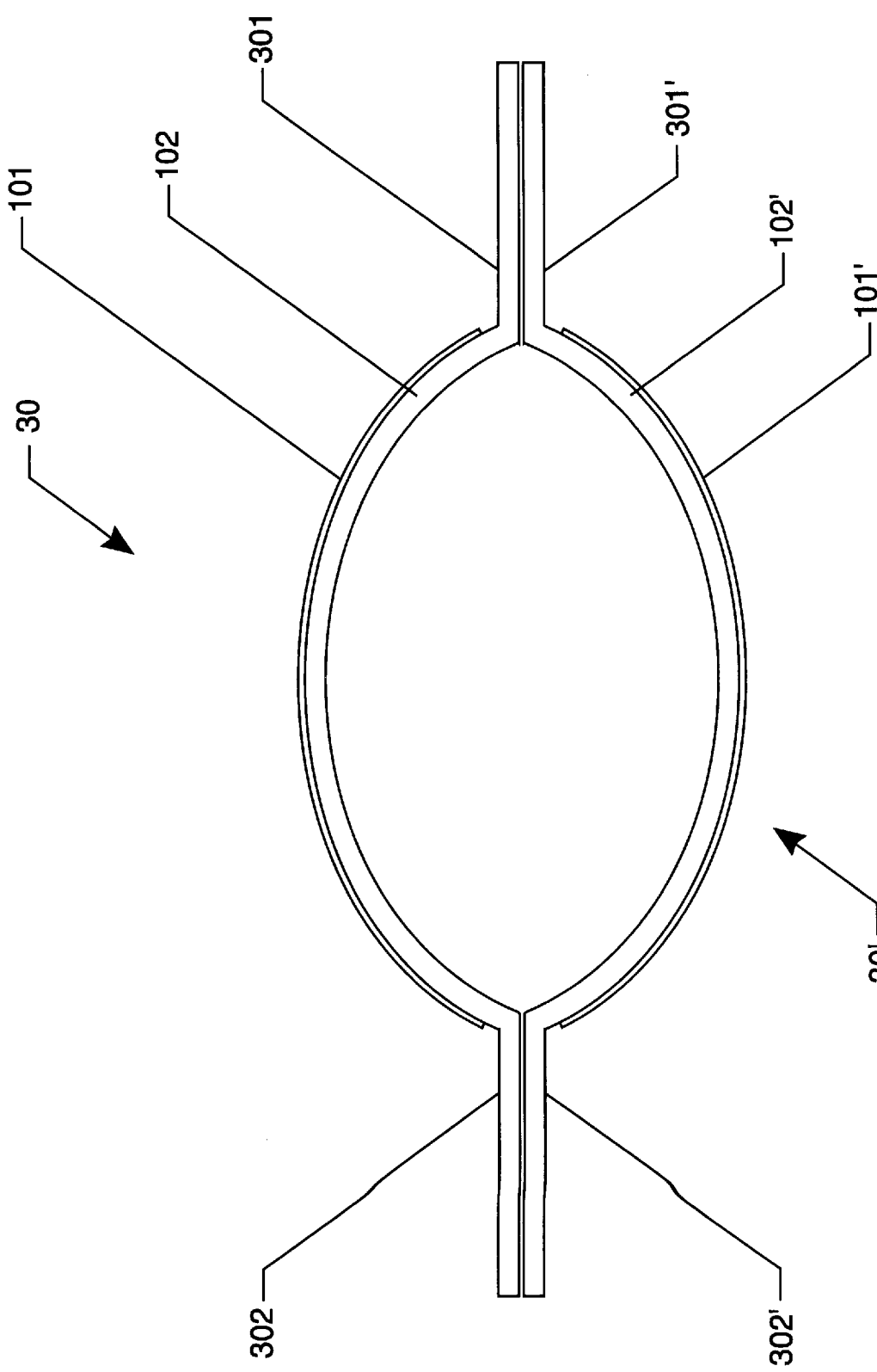
FIG. 7 is a side view of a bellows actuator composed of two bender actuators.

Another embodiment of the present invention is the bellows device produced when two actuators have the ends of their respective support layers attached to one another such that the concave side of the first actuator is oriented facing the concave side of the second actuator. It should be understood that this embodiment of the invention includes the stacking of multiple bellows devices. When multiple bellows devices are stacked the displacements of the individual bellows devices are linearly additive. The force produced by the stacked bellows type devices is limited to the force produced by the weakest bellows device in the series. FIG. 7 illustrates a bellows embodiment of the present invention utilizing two of the bender devices 30, 30' illustrated in FIG. 3.

For an application such as a pump it may be desirable to attach a plurality of bender actuators to one another. The bender actuators may be oriented such that the concave or convex sides of two actuators face one another or the actuators may be positioned so that the convex side of one is oriented to the concave side of another. The actuators may be connected to one another at any point along their respective lengths. The connection between the actuators may be in the way of welding, bolting, riveting, bonding, springs, a sliding fit device, a clamp, a loose connection, or any other conventional fastening means.

Figure 8:
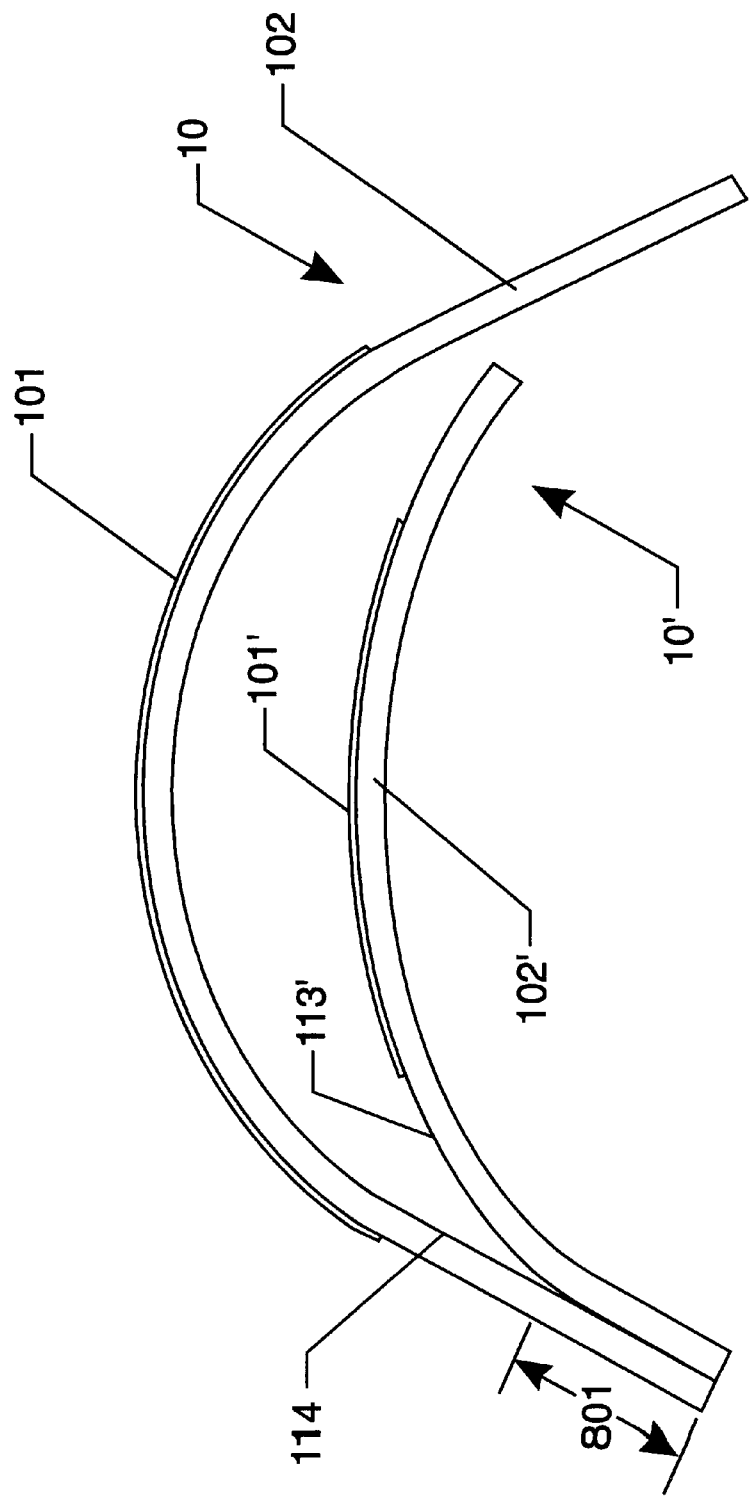
FIG. 8 is a side view of a two bender actuators attached to one another at a single end.

FIG. 8 illustrates an embodiment of the present invention in which a basic embodiment 10 is connected to another basic embodiment 10' at a single end 801. The basic embodiments 10, 10' are oriented such that the convex surface 113' of the lower basic embodiment 10' faces the concave surface 114 of the uppermost basic embodiment 10.

If a magnetostrictive material, which does not produce an electrical signal in response to interaction with a magnetic field, is used as the sole electroactive material to form the sensor element, the displacement of the sensor must be measured by optical techniques, displacement scales. Alternatively, a piezoelectric layer may be attached to the support layer in a location where it will experience mechanical stimulation in the form of strain, or to the magnetostrictive material, forming a two layer electroactive material. The straining of the piezoelectric material produces an electrical signal which may then be measured as an indication of the magnetic field strength. The use of the piezoelectric to produce an electrical signal facilitates calibration and allows for the electroactive device to be utilized in a remote sensing capacity.

Figure 9:
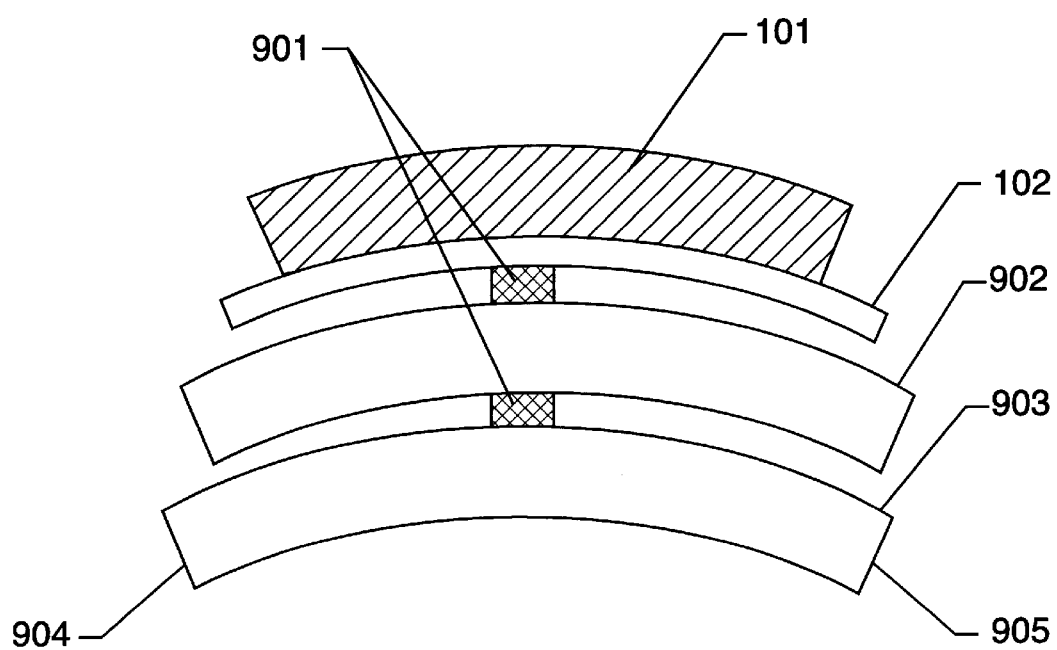
FIG. 9 is a side view of a bender actuator attached to a mounting surface which is attached to an additional layer.

FIG. 9 illustrates an embodiment of the present invention in which a basic embodiment 10 is connected to a mounting surface 902 at a single point further connected to an additional layer 903. The connections between the basic embodiment 10 of the present invention, the mounting layer 902 and the further components of the structure, and their respective materials are chosen based upon the specific materials involved in the fabrication of the electroactive device, the environment in which the embodiment of the present invention is to operate, and the nature in which the embodiment is to be used, i.e., as a sensor, or as an active control device for use in jitter and vibration suppression, or vibration generation. The material and configuration of additional layer 903 is selected based on factors including the material strength, elasticity, and dynamic characteristics.

The mounting surface 902 and the additional layer 903 may each be single thin surfaces (as depicted in FIG. 9), massive relative to the electroactive device, a single surface of a single object, multiple faces of a single object, or surfaces of multiple objects. The ends 904, 905 of the additional layer 903 as shown are not in contact with any surface other than the mounting surface; alternatively, they may be configured to restrict movement along the surface with which they are in contact, to facilitate sliding along that surface, or to allow rolling along that surface by the use of bearings or other means such as an axle and wheels.

Additional layers analogous to the mounting surface 902 may be added to achieve the dynamic characteristics required in a specific application.

The dynamic response of the present invention is selected by lengthening or shortening the amount the support layer extends beyond the edge of the electroactive material along the length of the electroactive device. The dynamic response is also affected by the distribution mass, load, stiffness, curvature, and amount of pre-stress of the support layer. Furthermore, additional mass may be added to or subtracted from the support layer extending beyond the edge of the electroactive material along the length of the electroactive device in order to influence the dynamic response characteristics of the electroactive device. The dynamic response characteristics of the electroactive device may also be modified by the addition of mass to the device in the region of the device occupied by the electroactive material. An electroactive device with a variable frequency response may be achieved by the addition of a mass that may be translated along the length of the electroactive device in the region of the electroactive material.

Electroactive devices utilizing the present invention can be used in accelerometers, active structures, brakes, displacement actuators, electrical relays, electromagnetic sensors and actuators, electromechanical sensors and actuators, focus mechanisms for mirrors, magnetic field driven actuators, magnetic field sensors, motors, optics, pressure transducers, pumps, sensors, sonic transducers, switches, thermal sensors and actuators, thermomechanical sensors and actuators, valves, and vibration suppression devices.

The many features and advantages of the present invention are apparent from the detailed specification, and thus it is intended by the appended claims to cover all such features and advantages of the apparatus which fall within the true spirit and scope of the invention. Further, since numerous modifications and changes will readily occur to those skilled in the art from the disclosure of this invention, it is not desired to limit the invention to the exact construction and operation illustrated and described, accordingly, suitable modifications and equivalents may be resorted to, as falling within the scope and spirit of the invention.

What is claimed as new and desired to be secured by Letters Patent of the United States:

What is claimed is:

1. An electroactive device, comprising:
   a pre-stressed, curved electroactive material having a convex surface and a concave surface;
   a support layer having a curved central portion and two ends, the curved central portion having a convex surface and a concave surface, the convex surface being conformed to match to the shape of the concave surface of the pre-stressed curved electroactive material, the convex surface of the central portion being in contact with the concave surface of the pre-stressed, curved electroactive material; and
   a means for attaching the convex surface of the central portion of the support layer to the concave surface of the pre-stressed, curved electroactive material.

2. An electroactive device as recited in claim 1 wherein the support layer is selected from the group consisting of metals, plastics and ceramics.

3. An electroactive device as recited in claim 1 wherein the pre-stressed, curved electroactive material is selected from the group consisting of ceramics and metallic alloys.

4. An electroactive device as recited in claim 1 wherein the pre-stressed, curved electroactive material is selected from the group consisting of ferroelectric, piezoelectric, pyroelectric, and magnetostrictive materials.

5. An electroactive device as recited in claim 1 wherein the pre-stressed, curved electroactive material is a piezoelectric material, further comprising a pair of electrodes, one electrode being attached to the convex surface of the pre-stressed, curved electroactive material, the other electrode being attached to the concave surface of the pre-stressed, curved electroactive material.

6. An electroactive device as recited in claim 1 wherein the means for attaching the convex surface of the central portion of the support layer to the concave surface of the pre-stressed, curved electroactive material is selected from the group consisting of adhesives, cerment, braze alloys, soldering, welding, and adhesive bonding.

7. An electroactive device as recited in claim 1 further comprising at least one mounting surface attached to at least one end of the support layer.

8. An electroactive device as recited in claim 7 wherein the mounting surface is chosen from the group consisting of metals, plastics, ceramics, composites and organic materials.

9. An electroactive device as recited in claim 7 wherein the mounting surface is a flexible layer.

10. An electroactive device as recited in claim 7 wherein the means for attaching at least one end of the support layer to the mounting surface is chosen from the group consisting of welding, brazing, soldering, bolting, riveting, crimping, clamping, hinging, mechanical fastening, mechanical interlocking, and adhesive bonding.

11. An electroactive device, comprising:
    at least one pre-stressed, curved electroactive material having a convex surface and a concave surface;
    at least one support layer having a curved central portion and two ends, the curved central portion having a convex surface and a concave surface, the convex surface being conformed to match to the shape of the concave surface of the pre-stressed curved electroactive material, the convex surface of the central portion being in contact with the concave surface of the pre-stressed, curved electroactive material; and
    a means for attaching the convex surface of the central portion of the support layer to the concave surface of the pre-stressed, curved electroactive material.

* * * * *